United States Patent
Lu

(10) Patent No.: US 11,061,296 B2
(45) Date of Patent: Jul. 13, 2021

(54) MICROWAVE AMPLITUDE-PHASE CONTROLLER AND METHOD OF CONTROLLING AMPLITUDE AND/OR PHASE OF MICROWAVE

(71) Applicant: BOE Technology Group Co., Ltd., Beijing (CN)

(72) Inventor: Yongchun Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/488,000

(22) PCT Filed: Feb. 1, 2019

(86) PCT No.: PCT/CN2019/074442
§ 371 (c)(1),
(2) Date: Aug. 22, 2019

(87) PCT Pub. No.: WO2020/007044
PCT Pub. Date: Jan. 9, 2020

(65) Prior Publication Data
US 2020/0379284 A1    Dec. 3, 2020

(30) Foreign Application Priority Data
Jul. 2, 2018 (CN) .......................... 201810710415.6

(51) Int. Cl.
*G02F 1/1343* (2006.01)
*G02F 1/139* (2006.01)
*G02F 1/133* (2006.01)

(52) U.S. Cl.
CPC ........ *G02F 1/139* (2013.01); *G02F 1/134309* (2013.01); *G02F 1/13306* (2013.01)

(58) Field of Classification Search
CPC .......... G02F 1/0045; G02F 1/13; G02F 1/139; G02F 1/13306; G02F 1/1343; G02F 1/134309; G02F 1/1333
See application file for complete search history.

(56) References Cited

U.S. PATENT DOCUMENTS 9,268,016 B2    2/2016  Smith et al.
9,306,256 B2 *  4/2016  Bulja ........................ H01P 1/18
(Continued)

FOREIGN PATENT DOCUMENTS

CN    104584326 A    4/2015
CN    106532200 A    3/2017
(Continued)

OTHER PUBLICATIONS

Second Office Action, including Search Report, for Chinese Patent Application No. 201810710415.6, dated Sep. 2, 2020, 19 pages.

*Primary Examiner* — Thoi V Duong
(74) *Attorney, Agent, or Firm* — Westman, Champlin & Koehler, P.A.

(57) ABSTRACT

A microwave amplitude-phase controller and a method of controlling amplitude and/or phase of a microwave are provided. The microwave amplitude-phase controller includes: a first substrate and a second substrate opposite to each other; a liquid crystal layer between the first substrate and the second substrate; a conductive layer on a side of the first substrate facing the liquid crystal layer, the conductive layer being configured to receive a first voltage signal; and a resonant structure on a side of the second substrate facing the liquid crystal layer, the resonant structure being configured to receive a second voltage signal and to transmit a microwave signal.

16 Claims, 5 Drawing Sheets

(56) References Cited

U.S. PATENT DOCUMENTS

| | | |
|---|---|---|
| 10,386,479 B2 | 8/2019 | Brady et al. |
| 10,416,302 B2 | 9/2019 | Smith et al. |
| 2013/0335256 A1 | 12/2013 | Smith et al. |
| 2016/0266248 A1 | 9/2016 | Smith et al. |
| 2017/0003389 A1 | 1/2017 | Brady et al. |
| 2018/0375201 A1* | 12/2018 | Wu .................. H01Q 1/364 |
| 2020/0174050 A1* | 6/2020 | Lu ................. G01R 27/2623 |

FOREIGN PATENT DOCUMENTS

| | | |
|---|---|---|
| CN | 206210991 U | 5/2017 |
| CN | 107015220 A | 8/2017 |
| CN | 107394318 A | 11/2017 |
| CN | 108828811 A | 11/2018 |
| JP | 2004104382 A | 4/2004 |
| JP | 2006019855 A | 1/2006 |

\* cited by examiner

MICROWAVE AMPLITUDE-PHASE CONTROLLER AND METHOD OF CONTROLLING AMPLITUDE AND/OR PHASE OF MICROWAVE

CROSS-REFERENCE TO RELATED APPLICATION

This application is a Section 371 National Stage Application of International Application No. PCT/CN2019/074442, filed on Feb. 1, 2019, and claims the benefit of Chinese Patent Application No. 201810710415.6 filed on Jul. 2, 2018 in the National Intellectual Property Administration of China, the whole disclosure of which is incorporated herein by reference.

TECHNICAL FIELD

The present disclosure relates to the field of microwave controlling technologies, and in particular, to a microwave amplitude-phase controller and a method of controlling amplitude and/or phase of a microwave.

BACKGROUND

Microwave reconfigurable devices play an important role in building intelligent wireless communication networks and promoting the development of 5G communication technologies. However, existing microwave reconfigurable devices may only control the amplitude of an output microwave signal or only control the phase of the output microwave signal if only a single control mechanism is used at a fixed frequency position. In this case, the application scenarios of the microwave reconfigurable devices are greatly limited. Although multiple control mechanisms may be used to simultaneously control the amplitude and phase of the output microwave signal, the structure is complicated and expensive, and multiple control mechanisms consume more microwave energy, which reduces the working efficiency of the microwave reconfigurable devices.

SUMMARY

Some Embodiments of the present disclosure provide a microwave amplitude-phase controller comprising: a first substrate and a second substrate opposite to each other; a liquid crystal layer between the first substrate and the second substrate; a conductive layer on a side of the first substrate facing the liquid crystal layer, the conductive layer being configured to receive a first voltage signal; and a resonant structure on a side of the second substrate facing the liquid crystal layer, the resonant structure being configured to receive a second voltage signal and to transmit a microwave signal.

In some embodiments, the microwave amplitude-phase controller further comprising: a first alignment film between the conductive layer and the liquid crystal layer; and a second alignment film between the resonant structure and the liquid crystal layer.

In some embodiments, the resonant structure comprises: a capacitor; a bridged conductive structure in parallel with the capacitor, the bridged conductive structure being connected to both ends of the capacitor; and a first signal line and a second signal line respectively electrically connected to the both ends of the capacitor, the first signal line being configured to receive a microwave signal to be modulated, and the second signal line being configured to output a modulated microwave signal.

In some embodiments, the capacitor comprises a first conductive strip and a second conductive strip which are opposite and parallel to each other, and spaced apart from each other, the first conductive strip and the second conductive strip are of equal length and equal width, and the bridged conductive structure comprises a third conductive strip which is axisymmetric, the third conductive strip having an axis of symmetry parallel to both the first conductive strip and the second conductive strip.

In some embodiments, the resonant structure further comprises a first connecting line and a second connecting line, the first conductive strip is electrically connect to the first signal line and one end of the bridged conductive structure through the first connecting line, and the second conductive strip is electrically connected to the second signal line and the other end of the bridged conductive structure through the second connecting line.

In some embodiments, the first conductive strip and the second conductive strip are both elongated and are perpendicular to the first connecting line and the second connecting line, respectively.

In some embodiments, the first conductive strip and second conductive strip are symmetrically arranged with respect to the axis of symmetry of the third conductive strip.

In some embodiments, the length of the third conductive strip is less than or equal to $1\lambda$, wherein $\lambda$ is an operating wavelength of a microwave to be modulated.

In some embodiments, the first conductive strip and the second conductive strip have a length less than or equal to $0.5\lambda$, and a width less than or equal to $0.5\lambda$, wherein $\lambda$ is an operating wavelength of a microwave to be modulated.

In some embodiments, a gap between the first conductive strip and the second first conductive strip has a width less than or equal to $0.5\lambda$, wherein $\lambda$ is an operating wavelength of a microwave to be modulated.

In some embodiments, the capacitor comprises two interdigitated electrodes which are opposite to each other and spaced apart from each other.

In some embodiments, an orthographic projection of the liquid crystal layer on the first substrate at least covers an orthographic projection of the capacitor on the first substrate.

In some embodiments, a thickness of the liquid crystal layer is less than or equal to $0.5\lambda$, wherein $\lambda$ is an operating wavelength of a microwave to be modulated.

In some embodiments, the microwave amplitude-phase controller further comprising: a frame between the first substrate and the second substrate, wherein the frame and the first substrate and the second substrate enclose a cavity, the liquid crystal layer being filled in the cavity.

In some embodiments, the first alignment film and the second alignment film have the same alignment direction.

In some embodiments, the conductive layer is grounded.

Some embodiments of the present disclosure provide a method of controlling amplitude and/or phase of a microwave by using the microwave amplitude-phase controller according to the above embodiments, comprising: applying the first voltage signal to the conductive layer of the microwave amplitude-phase controller, and applying the second voltage signal to the resonant structure of the microwave amplitude-phase controller; and inputting a microwave signal to be modulated to the resonant structure of the microwave amplitude-phase controller, and adjusting a voltage difference between the first voltage signal and the second voltage signal until a modulated microwave signal output by the resonant structure has required amplitude and/or phase.

BRIEF DESCRIPTION OF THE DRAWINGS

In order to much clearly illustrate the embodiments of the present disclosure or the technical solutions in the prior art, the drawings to be used in the embodiments or the description of the prior art will be briefly described below. Obviously, the drawings in the following description only relate to some embodiment of the present disclosure, for those skilled in the art, other drawings may be obtained according to the drawings without any creative effort.

DETAILED DESCRIPTION OF THE EMBODIMENTS

In order to ensure that the above objects, features and advantages of the present disclosure may be much clearly understood, the technical solutions in the embodiments of the present disclosure will be clearly and completely described below in conjunction with the accompanying drawings in the embodiments of the present disclosure. It is apparent that the described embodiments are only a part of the embodiments of the present disclosure, and not all of them. All other embodiments obtained by those skilled in the art based on the embodiments of the present disclosure without creative efforts are within the scope of the present disclosure.

It should be noted that, in the embodiments of the present disclosure, for convenience of description, a plane in which the microwave amplitude-phase controller 100 is located (which may also be regarded as a plane where a first substrate 1 or a second substrate 2 is located) is the XOY plane. In the XOY plane, X direction and Y direction are two directions perpendicular to each other; a direction perpendicular to the XOY plane and directed from the first substrate 1 to the second substrate 2 is Z direction. However, such directional descriptions are not to be construed as limiting the disclosure.

Figure 1:
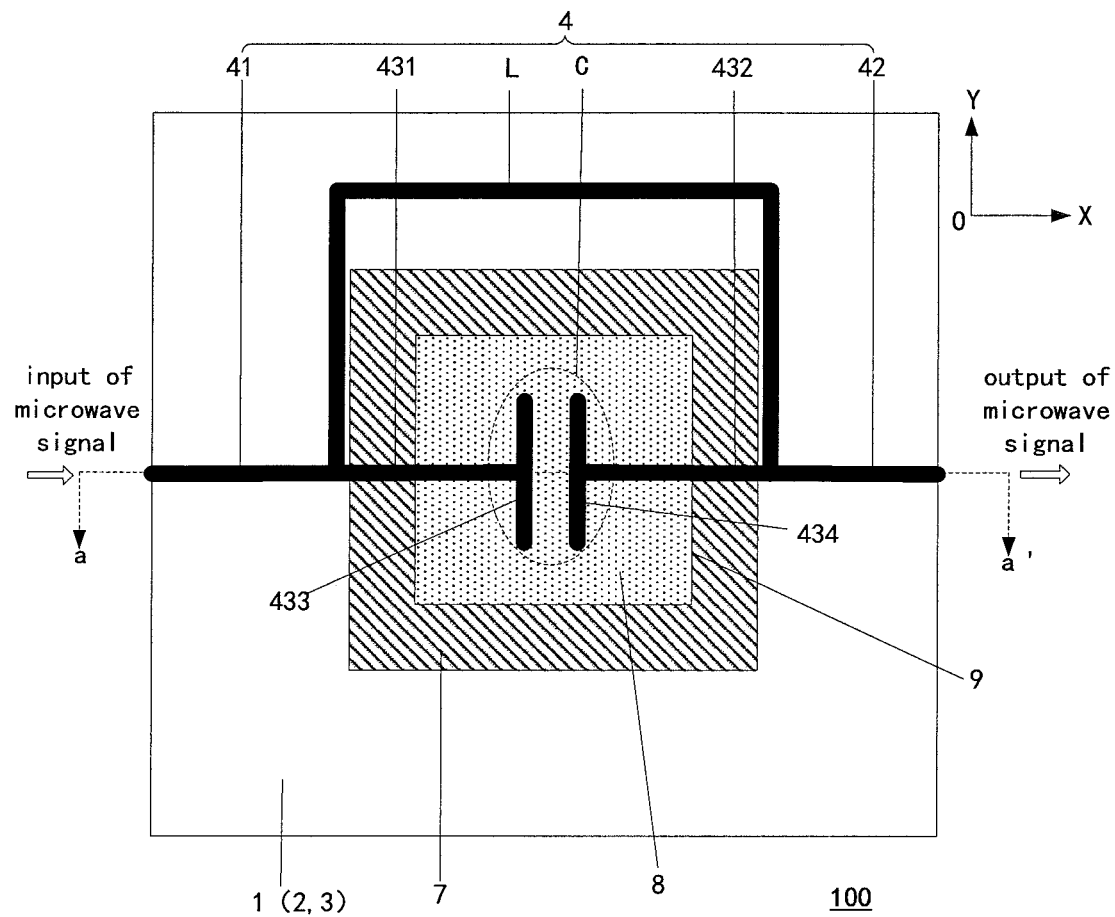
FIG. 1 is a plan view of a microwave amplitude-phase controller according to some embodiments of the present disclosure, showing partial details of a structure of the microwave amplitude-phase controller.
Figure 2:
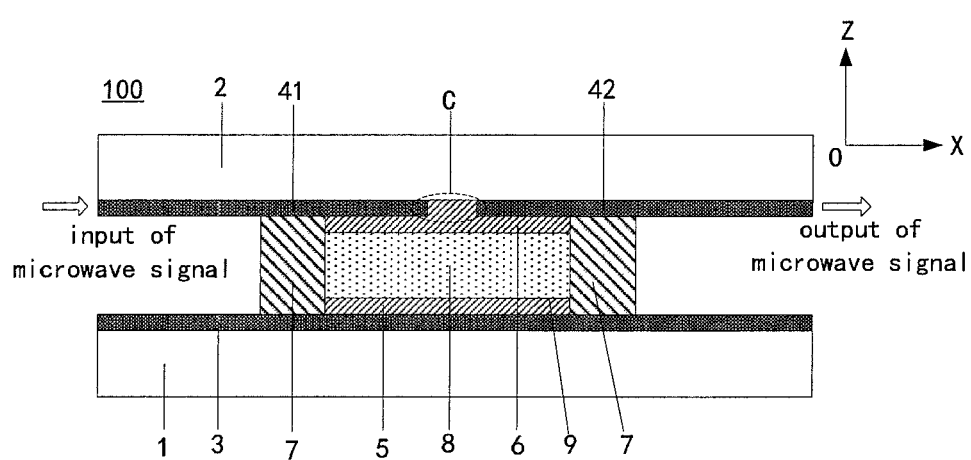
FIG. 2 is a cross-sectional structural view of the microwave amplitude-phase controller shown in FIG. 1 taken along a dotted line aa'.

Some embodiments of the present disclosure provide a microwave amplitude-phase controller. As shown in FIG. 1 and FIG. 2, the microwave amplitude-phase controller 100 includes: a first substrate 1 and a second substrate 2 disposed opposite to each other; a conductive layer 3 and a first alignment film 5 sequentially disposed on a side of the first substrate 1 facing the second substrate 2; a resonant structure 4 and a second alignment film 6 sequentially disposed on a side of the second substrate 2 facing the first substrate 1; and a liquid crystal layer 8 between the first substrate 1 and the second substrate 2.

In the above microwave amplitude-phase controller 100, the conductive layer 3 such as a planar electrode is configured to receive a first voltage signal, and the resonant structure 4 is configured to receive a second voltage signal. At least one of the first voltage signal and the second voltage signal is adjustable, so that a voltage difference between the first voltage signal and the second voltage signal is adjustable.

The resonant structure 4 is configured to transmit a microwave signal. Exemplarily, the resonant structure 4 has a microwave signal input end for receiving a microwave signal, and a microwave signal output end for outputting a microwave signal.

In the above microwave amplitude-phase controller 100, the conductive layer 3 and the resonant structure 4 are respectively disposed on upper and lower sides of the liquid crystal layer 8, and the voltage difference between the conductive layer 3 and the resonant structure 4 is adjustable; and the upper and lower sides of the liquid crystal layer 8 are respectively provided with the first alignment film 5 and the second alignment film 6 to orient liquid crystal molecules. When the voltage difference between the conductive layer 3 and the resonance structure 4 is changed, the liquid crystal molecules are deflected, so that the equivalent dielectric constant of the liquid crystal layer 8 changes.

When the microwave amplitude-phase controller 100 is used to control the microwave, the microwave is input to the resonant structure 4, the resonant structure 4 is caused to resonate, and the equivalent dielectric constant of the liquid crystal layer 8 may affect the resonance effect, thereby affecting the amplitude and phase of the microwave. By adjusting the voltage difference applied between both sides of the liquid crystal layer 8, the liquid crystal molecules are deflected to different degrees, causing different changes in the equivalent dielectric constant of the liquid crystal layer 8, thereby generating different effects on the resonance in the resonant structure 4. It may make different changes in the amplitude and phase of the microwave, and finally a microwave with a desired amplitude and phase is obtained, and the simultaneous control of the amplitude and phase of the microwave is realized.

Compared with an existing device for simultaneously controlling amplitude and phase of a microwave, the microwave amplitude-phase controller 100 provided in the embodiments may realize simultaneous control of the amplitude and phase of the microwave without using multiple control mechanisms, and the structure is very simple, the cost is low, it does not consume too much microwave energy, and the work efficiency is high.

In addition, the operating frequency of the microwave amplitude-phase controller 100 is changed by designing an internal structure of the microwave amplitude and phase controller 100, so that the microwave amplitude and phase controller 100 may be implemented to only change the phase of the microwave, or only change the amplitude of the microwave, or simultaneously change the amplitude and phase of the microwave. That is, the above microwave amplitude-phase controller 100 may be used alone as an amplitude controller, or may be used alone as a phase controller (i.e., phase shifter), or may be used as both an amplitude controller and a phase controller.

In the above microwave amplitude-phase controller 100, the structural design of the resonant structure 4 is important for effectively controlling at least one of the amplitude and the phase, and some possible designs are exemplified below.

Referring to FIG. 1, the resonant structure 4 includes a capacitor, such as a slot capacitor C, and a bridged conductive structure L in parallel with the slot capacitor C, the bridged conductive structure L being connected to both ends of the slot capacitor C. When the microwave is input, the microwave will cause the slot capacitor C to be coupled to generate resonance, and the resonance effect in the slot capacitor C will induce the bridged conductive structure L, and the bridged conductive structure L will in turn affect the resonance in the slot capacitor C, so that the entire resonant structure 4 generates a resonance effect of extremely high quality factor.

The resonant structure 4 further includes a first signal line 41 and a second signal line 42 which are respectively disposed at both ends of the slot capacitor C and respectively electrically connected to the both ends of the slot capacitor C. The first signal line 41 serves as the microwave signal input end of the resonant structure 4 (i.e., a microwave signal input end of the entire microwave amplitude-phase controller 100) for receiving the microwave signal to be modulated. The first signal line 42 serves as the microwave signal output end of the resonant structure 4 (i.e., a microwave signal output end of the entire microwave amplitude-phase controller 100) for outputting the modulated microwave signal. In some embodiment, the first signal line 41 and the second signal line 42 have equal length and equal width.

The resonant structure 4 further includes: a first connecting line 431 and a second connecting line 432. One electrode of the slot capacitor C is electrically connected to the first signal line 41 and one end of the bridged conductive structure L through the first connecting line 431, and the other electrode of the slot capacitor C is electrically connected to the second signal line 42 and the other end of the bridged conductive structure L through the second connecting line 432.

As a possible design, please continue to refer to FIG. 1, the slot capacitor C includes two opposite and spaced conductive strips, namely a first conductive strip 433 and a second conductive strip 434. The conductive strips are, for example, metal strips, and the two conductive strips are, for example, elongated and parallel to each other. The two conductive strips of the slot capacitor C have the same length and the same width. The bridged conductive structure L includes a third conductive strip. The bridged conductive structure L has an axisymmetric structure. Optionally, the first connecting line 431 and the second connecting line 432 have the same length and the same width; the two conductive strips of the slot capacitor C are perpendicular to both the first connecting line 431 and the second connecting line 432; the two conductive strips of the slot capacitor C are symmetrically arranged with respect to an axis of symmetry of the bridged conductive structure L; the first signal line 41 and the second signal line 42 are symmetrically arranged with respect to the axis of symmetry of the bridged conductive structure L, such that the resonant structure 4 composed of the slot capacitor C, the bridged conductive structure L, the first connecting line 431, the second connecting line 432, the first signal line 41 and the second signal line 42 has an axisymmetric structure, which is advantageous for enhancing resonance and improving quality factor.

With regard to a design of the resonant structure 4, sizes of various components of the resonant structure 4 are dependent on different size specifications, operating frequency requirements and the like of the microwave amplitude-phase controllers 100.

Figure 3:
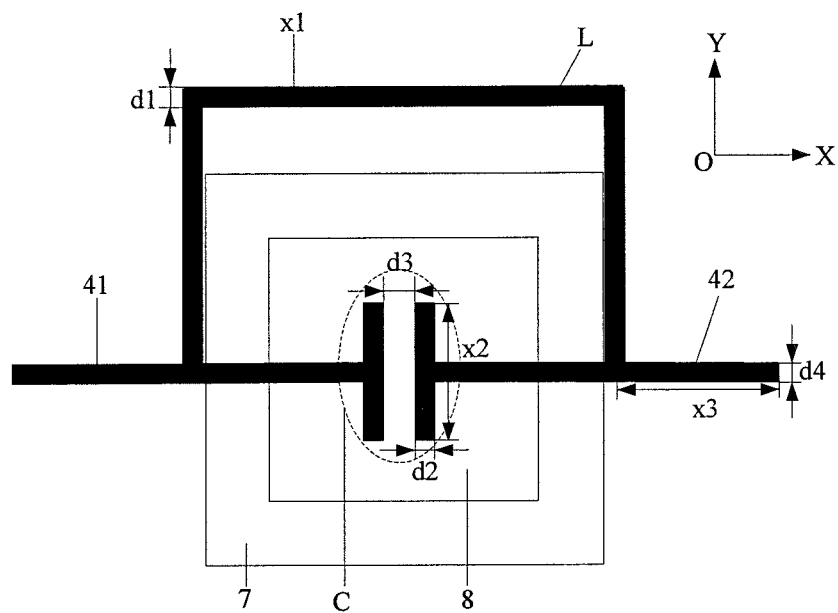
FIG. 3 is a plan view showing dimensions of components of a resonant structure shown in FIG. 1.

Exemplarily, taking the structure of the resonant structure 4 shown in FIG. 1 as an example, the liquid crystal layer 8 in the microwave amplitude-phase controller 100 has a square shape as a whole, one set of opposite sides thereof is parallel to the X direction, and the other set of opposite sides is parallel to the Y direction. The two conductive strips of the slot capacitor C of the resonant structure 4 are parallel to the Y direction. Referring to FIG. 3, each size and each parameter may be designed as below (the following description assumes that an operating wavelength of the microwave to be modulated which is input to the microwave amplitude-phase controller 100 is $\lambda$):

A length of the bridged conductive structure L (including the sum of a length of a portion parallel to the X direction and lengths of portions parallel to the Y direction) is denoted as x1, and $x1 \leq 1\lambda$, optionally, $x1 \leq 0.5\lambda$, a width thereof is denoted as d1, and $d1 \leq 0.5\lambda$, optionally, the width $d1 \leq 0.2\lambda$;

The length of each of the two conductive strips of the slot capacitor C is denoted as x2, and $x2 \leq 0.5\lambda$, a width of each of the two conductive strips of the slot capacitor C is denoted as d2, and $d2 \leq 0.5\lambda$, optionally, the width $d2 \leq 0.2\lambda$, a gap between the two conductive strips is denoted as d3, and $d3 \leq 0.5\lambda$, optionally, the gap $d3 \leq 0.2\lambda$; and The length of each of the first signal line 41 and the second signal line 42 is denoted as x3, and $x3 \leq 0.5\lambda$, the width of each of the first signal line 41 and the second signal line 42 is denoted as d4, and $d4 \leq 0.5\lambda$, optionally, the width $d4 \leq 0.2\lambda$.

Figure 4:
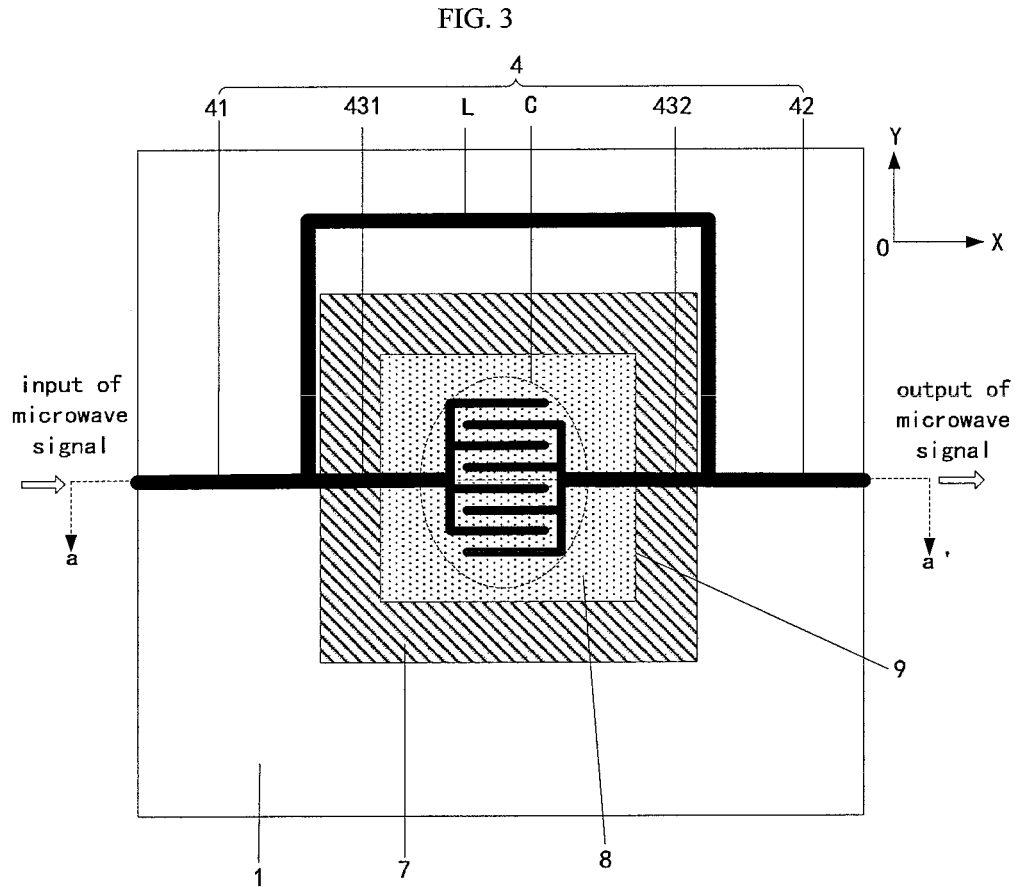
FIG. 4 is a plan view of a microwave amplitude-phase controller according to other embodiments of the present disclosure.

In other embodiments, referring to FIG. 4, the slot capacitor C may include two electrodes which are opposite to and spaced apart from each other. The two electrodes are interdigitated electrodes, and fingers of the two electrodes are interdigitated. The two electrodes are for example, metal electrodes.

In the embodiments of the present disclosure, the conductive layer 3 and the resonant structure 4 are made of a conductive material; optionally, they are made of metal, such as gold, silver, copper, aluminum, or the like. A wire for supplying the first voltage signal may be connected to any position on the conductive layer 3, and a wire for supplying the second voltage signal may be connected to any position on the resonant structure 4, such as the first signal line 41.

A thickness of each of the conductive layer 3 and the resonant structure 4 may be equal to or less than $0.5\lambda$.

A preparation process of the conductive layer 3 may include: forming a whole layer of a conductive film on the first substrate 1 by using a conductive material and by means of performing a process such as evaporation, coating, printing, deposition or the like. A preparation process of the resonant structure 4 may include: firstly, forming a whole layer of a film having a designed thickness on the second substrate 2 by using a conductive material, and then removing a specific portion of the formed film by a photolithography process, and retaining a portion so as to form a required resonant structure pattern.

In some embodiments, the conductive layer 3 can be grounded, that is, the first voltage signal connected to the conductive layer 3 is a ground voltage, so that the potential of the conductive layer 3 may be constant. When adjusting the voltage difference between the conductive layer 3 and the resonant structure 4, only the second voltage signal connected to the resonant structure 4 may be adjusted so as to simplify the operation.

Alignment directions of the first alignment film 5 and the second alignment film 6 are uniform such that the liquid crystal molecules in the liquid crystal layer 8 have a uniform orientation when no voltage is applied between both sides of the liquid crystal layer 8. The alignment directions of the first alignment film 5 and the second alignment film 6, that is, the orientation of the liquid crystal molecules in the liquid crystal layer 8 (the orientation described herein specifically refers to a orientation of a long axis of the liquid crystal molecules) may be in the X direction, or in the Y direction, or in any other direction on the XOY plane.

A thickness of the liquid crystal layer 8 may be equal to or less than $0.5\lambda$. Liquid crystal material may adopt nematic liquid crystal.

Dielectric constants of the first substrate 1 and the second substrate 2 may be in a range of 1.1 to 20, for example, may be 4.

Referring to FIG. 1 and FIG. 2 again, the microwave amplitude-phase controller 100 according to the embodiments of the present disclosure may further include a frame 7 disposed between the first substrate 1 and the second substrate 2. The frame 7 cooperates with the first substrate 1 and the second substrate 2 so as to form a cavity 9 in which the liquid crystal layer 8 is filled. The frame 7 functions to prevent the liquid crystal molecules in the liquid crystal layer 8 from leaking, and to maintain a gap between the first substrate 1 and the second substrate 2, so as to provide a support for the liquid crystal layer 8 sandwiched between the first substrate 1 and the second substrate 2. The frame 7 may be made of sealant.

As a possible design, an orthographic projection of the liquid crystal layer 8 on the first substrate 1 at least covers an orthographic projection of the slot capacitor C on the first substrate 1, such that an equivalent dielectric constant of the liquid crystal layer 8 may have a relatively sufficient influence on the resonance effect in the slot capacitor C, thereby sufficiently affecting the microwave transmitted in the resonance structure 4.

The structure of the microwave amplitude-phase controller 100 provided by the embodiments of the present disclosure has been described as above, and a method of controlling amplitude and/or phase of a microwave by using the above-described microwave amplitude-phase controller 100 will be described below.

It should be noted that, for the microwave amplitude-phase controller 100 in the embodiments, control effects on the microwave are different based on different operating frequencies. Specifically, when the operating frequency of the microwave amplitude-phase controller 100 is a certain frequency, the amplitude and phase of the microwave may be simultaneously modulated; when the operating frequency of the microwave amplitude-phase controller 100 is another frequency, only the amplitude of the microwave may be modulated; when the operating frequency of the microwave amplitude-phase controller 100 is still another frequency, only the phase of the microwave may be modulated. In practical application, the purpose of adjusting the operating frequency of the microwave amplitude-phase controller 100 is achieved by adjusting an internal structure of the microwave amplitude-phase controller 100, for example, adjusting the length, width, shape, or the like of the bridged conductive structure L, adjusting the length, width, shape or the like of the electrodes of the capacitor C, or the gap between the two electrodes of the capacitor C, adjusting a coverage area of the liquid crystal layer 8, or the like.

Figure 5:
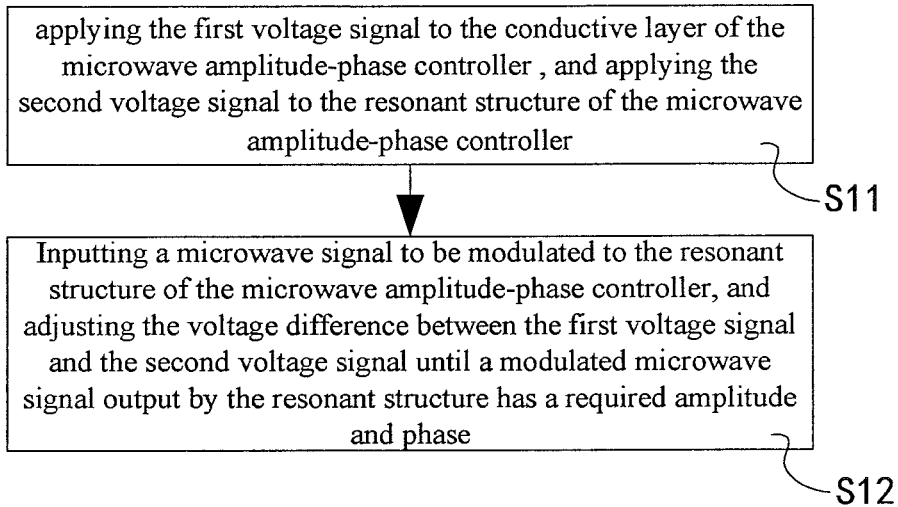
FIG. 5 is a basic flowchart of a method of controlling amplitude and/or phase of a microwave according to some embodiment of the present disclosure.

Referring to FIG. 5, some embodiments of the present disclosure provides a method of controlling amplitude and phase of a microwave, the method includes the following steps:

S11, applying the first voltage signal to the conductive layer 3 of the microwave amplitude-phase controller 100, and applying the second voltage signal to the resonant structure 4 of the microwave amplitude-phase controller 100;

S12, inputting a microwave signal to be modulated to the resonant structure 4 of the microwave amplitude-phase controller 100, and adjusting the voltage difference between the first voltage signal and the second voltage signal to change the equivalent dielectric constant of the liquid crystal layer 8 so as to affect the amplitude and the phase of the microwave, until a modulated microwave signal output by the resonant structure 4 has required amplitude and phase.

It should be noted that, before performing the above steps of the method, it is necessary to design the internal structure of the microwave amplitude-phase controller 100 in advance so that the operating frequency thereof is suitable for a case where the amplitude and phase of the microwave are simultaneously controlled.

Figure 6:
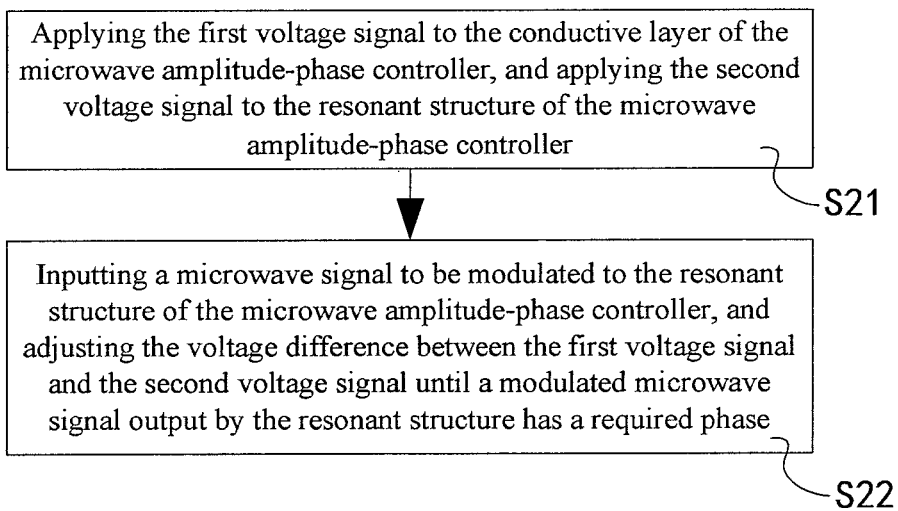
FIG. 6 is a basic flowchart of a method of controlling amplitude and/or phase of a microwave according to other embodiments of the present disclosure.

Referring to FIG. 6, some embodiments of the present disclosure provide a method of controlling phase of a microwave, the method includes the following steps:

S21, applying the first voltage signal to the conductive layer 3 of the microwave amplitude-phase controller 100, and applying the second voltage signal to the resonant structure 4 of the microwave amplitude-phase controller 100;

S22, inputting a microwave signal to be modulated to the resonant structure 4 of the microwave amplitude-phase controller 100, and adjusting the voltage difference between the first voltage signal and the second voltage signal to change the equivalent dielectric constant of the liquid crystal layer 8 so as to affect the phase of the microwave, until a modulated microwave signal output by the resonant structure 4 has a required phase.

It should be noted that, before performing the above steps of the method, it is necessary to design the internal structure of the microwave amplitude-phase controller 100 in advance so that the operating frequency thereof is suitable for a case where only the phase of the microwave is controlled.

Figure 7:
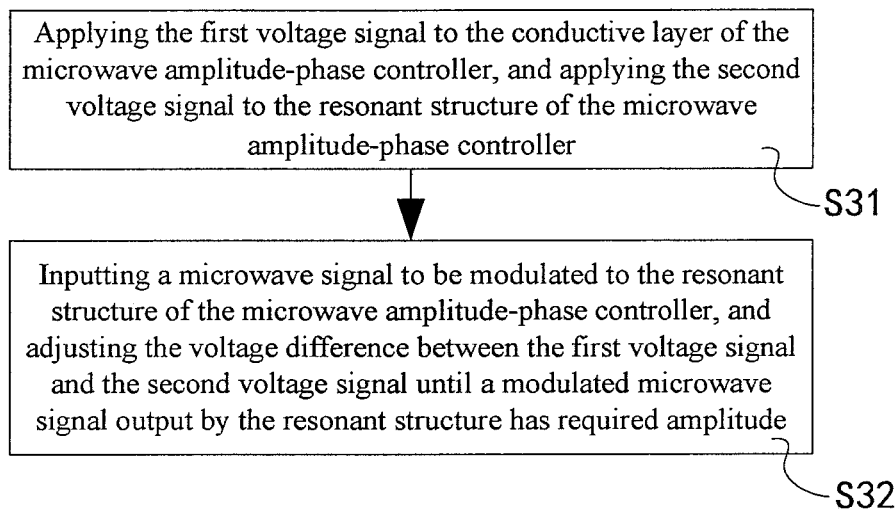
FIG. 7 is a basic flowchart of a method of controlling amplitude and/or phase of a microwave according to still other embodiments of the present disclosure.

Referring to FIG. 7, some embodiments of the present disclosure provides a method of controlling amplitude of a microwave, the method includes the following steps:

S31, applying the first voltage signal to the conductive layer 3 of the microwave amplitude-phase controller 100, and applying the second voltage signal to the resonant structure 4 of the microwave amplitude-phase controller 100;

S32: inputting a microwave signal to be modulated to the resonant structure 4 of the microwave amplitude-phase controller 100, and adjusting the voltage difference between the first voltage signal and the second voltage signal to change the equivalent dielectric constant of the liquid crystal layer 8 so as to affect the amplitude of the microwave, until a modulated microwave signal output by the resonant structure 4 has required amplitude.

It should be noted that, before performing the above steps of the method, it is necessary to design the internal structure of the microwave amplitude-phase controller 100 in advance so that the operating frequency thereof is suitable for a case where only the amplitude of the microwave is controlled.

Illustratively, a simulation model is established with the structure shown in FIGS. 1 and 3. It is assumed that in the microwave amplitude-phase controller 100, the dielectric constants of the first substrate 1 and the second substrate 2 are 4; the thickness of the liquid crystal layer 8 is 1 mm; the length of the portion, parallel to the X direction, of the bridged conductive structure L is 6 mm, the length of the portion, parallel to the Y direction, of the bridged conductive structure L is 6 mm, the total length x1 is 18 mm; the width d1 is 0.6 mm; the length x2 of each of the two conductive strips of the slot capacitor C is 2 mm, the width d2 is 0.7 mm, and the gap d3 between the two conductive strips is 0.7 mm; the length x3 of each of the first signal line 41 and the second signal line 42 is 4 mm, and the width d4 is 1 mm Through simulation, it can be seen that the operating frequency of the above microwave amplitude-phase controller 100 is adjustable in a range of 2.5 GHz to 3 GHz.

When the voltage difference between the first voltage signal and the second voltage signal changes from zero to a maximum value, the equivalent dielectric constant of the liquid crystal layer 8 in a direction perpendicular to the first substrate 1 and the second substrate 2 changes from 2.5 to 3.3. The change process represents a change in an orientation of the liquid crystal molecules from a horizontal orientation (parallel to the XOY plane) to a vertical orientation (parallel to the Z direction). For convenience of description, the following expressions for the equivalent dielectric constant of the liquid crystal layer 8 refer to the equivalent dielectric constant of the liquid crystal layer 8 in the direction perpendicular to the first substrate 1 and the second substrate 2.

Figure 8:
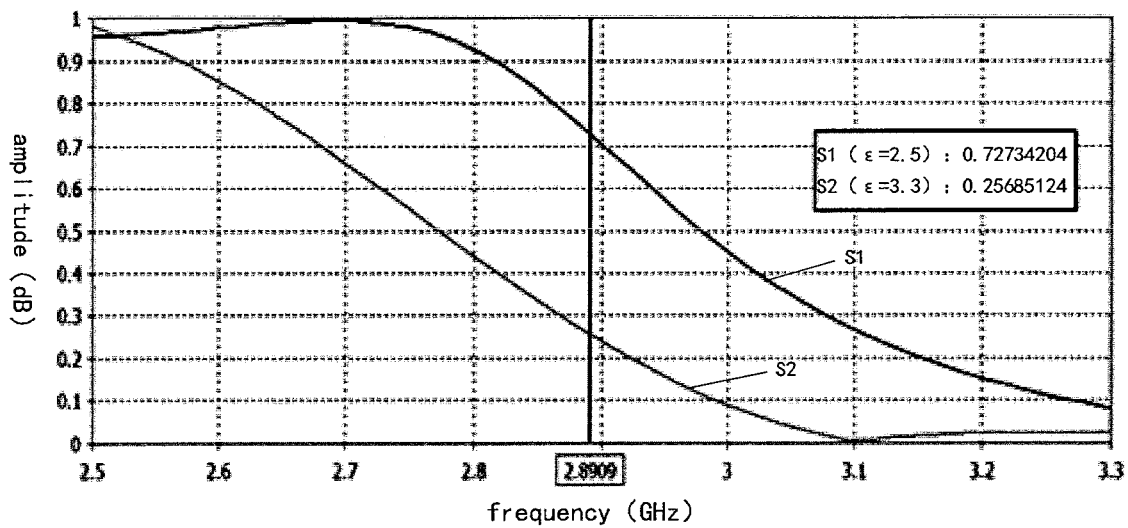
FIG. 8 is a curve chart showing amplitude control of a method of controlling amplitude and/or phase of a microwave according to an embodiment of the present disclosure.

Referring to FIG. 8, it is shown that the amplitude of the microwave output by the microwave amplitude-phase controller 100 changes as the equivalent dielectric constant of the liquid crystal layer 8 changes from 2.5 to 3.3. The curve S1 shows the amplitude of the microwave at the respective operating frequencies of the microwave amplitude-phase controller 100 when the liquid crystal molecules are oriented horizontally; and the curve S2 shows the amplitude of the microwave at the respective operating frequencies of the microwave amplitude-phase controller 100 when the liquid crystal molecules are oriented vertically.

Amplitude change rate of the microwave=(maximum amplitude value−minimum amplitude value)/amplitude intermediate value, and the amplitude intermediate value= (maximum amplitude value+minimum amplitude value)/2. Under the premise that the operating frequency of the microwave amplitude-phase controller 100 is constant, when the equivalent dielectric constant changes from 2.5 to 3.3, according to the curves S1 and S2, the amplitude change rate of the microwave may be calculated to be very large, close to 100%.

For example, in a case that the operating frequency of the microwave amplitude-phase controller 100 is 2.8909 GHz, when the equivalent dielectric constant $\varepsilon=2.5$, the amplitude of the microwave=0.772734204 (maximum amplitude value); when the equivalent dielectric constant $\varepsilon=3.3$, the amplitude of microwave amplitude=0.25685124 (minimum amplitude value). Therefore, it may be obtained by calculation that the amplitude change rate of the microwave is 95%, close to 100%. This indicates that the microwave amplitude-phase controller 100 has a wide adjustable range of microwave amplitude.

Figure 9:
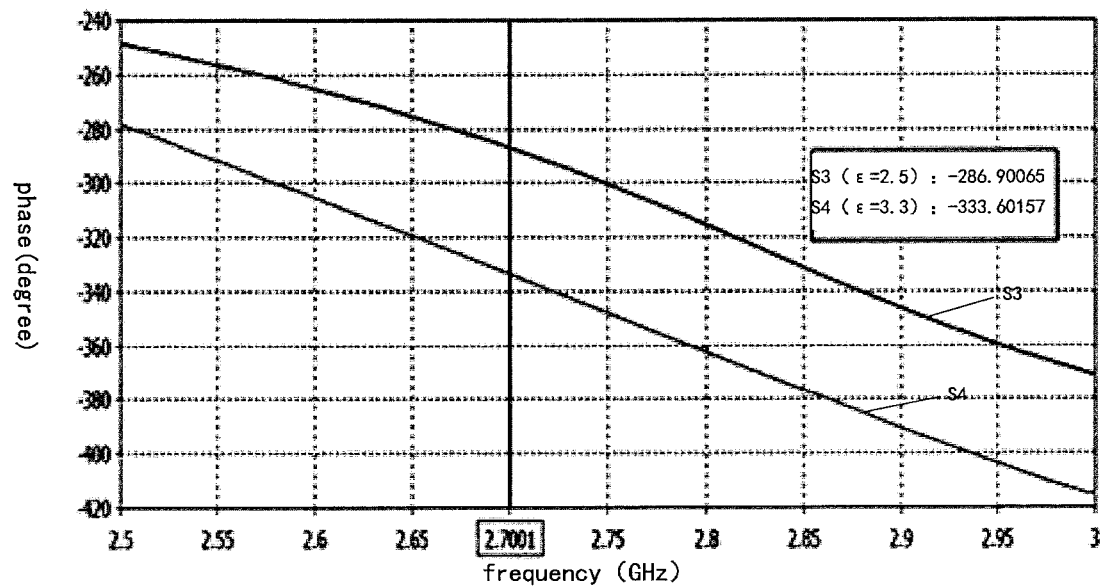
FIG. 9 is a curve chart showing phase control of a method of controlling amplitude and/or phase of a microwave according to an embodiment of the present disclosure.

Referring to FIG. 9, it is show that the phase of the microwave output from the microwave amplitude-phase controller 100 changes as the equivalent dielectric constant of the liquid crystal layer 8 changes from 2.5 to 3.3. The curve S3 shows the phase of the microwave at the respective operating frequencies of the microwave amplitude-phase controller 100 when the liquid crystal molecules are oriented horizontally; the curve S4 shows the phase of the microwave at the respective operating frequencies of the microwave amplitude-phase controller 100 when the liquid crystal molecules are oriented vertically.

Absolute phase shift of the microwave=maximum phase value−minimum phase value. Under the premise that the operating frequency of the microwave amplitude-phase controller 100 is constant, when the equivalent dielectric constant changes from 2.5 to 3.3, the absolute phase shift of the microwave may be calculated to be about 50 degrees according to the curves S3 and S4.

For example, in a case that the operating frequency of the microwave amplitude-phase controller 100 is 2.700 GHz, when the equivalent dielectric constant $\varepsilon=2.5$, the phase of the microwave=−286.90065 (maximum amplitude value); when the equivalent dielectric constant $\varepsilon=3.3$, the phase of the microwave=−333.60157 (minimum amplitude value). Therefore, it may be obtained by calculation that the absolute phase shift of the microwave is 46.7 degrees. This indicates that the adjustable range of the microwave phase of the microwave amplitude-phase controller 100 is not small. In order to obtain a larger phase shift in practical applications, a plurality of microwave amplitude-phase controllers 100 may be superimposed.

In addition, referring to FIG. 8 and FIG. 9, it can be found that when the operating frequency of the microwave amplitude-phase controller 100 is about 2.7 GHz, the change of the equivalent dielectric constant of the liquid crystal layer 8 causes the amplitude and phase of the microwave to change simultaneously. It is to be noted that when the microwave amplitude-phase controller 100 operates at about 2.7 GHz, the amplitude and phase of the microwave may be simultaneously changed, which is suitable for a scene in which the amplitude and phase of the microwave need to be simultaneously controlled.

When the operating frequency of the microwave amplitude-phase controller 100 is 2.5 GHz, the change in the equivalent dielectric constant of the liquid crystal layer 8 does not cause a change in the amplitude of the microwave (see FIG. 8), but may cause a change in the phase of the microwave (see FIG. 9). This indicates that the microwave amplitude-phase controller 100 may only change the phase of the microwave when operating at 2.5 GHz, which is suitable for a scene in which only the phase of the microwave needs to be controlled.

As for a scene where only the amplitude of the microwave needs to be controlled, usually, there is no concern whether the phase has changed when the amplitude of the microwave is controlled, therefore, the requirement to only control the amplitude of the microwave may be satisfied when the microwave amplitude-phase controller 100 operates at 2.5 GHz.

Figure 10:
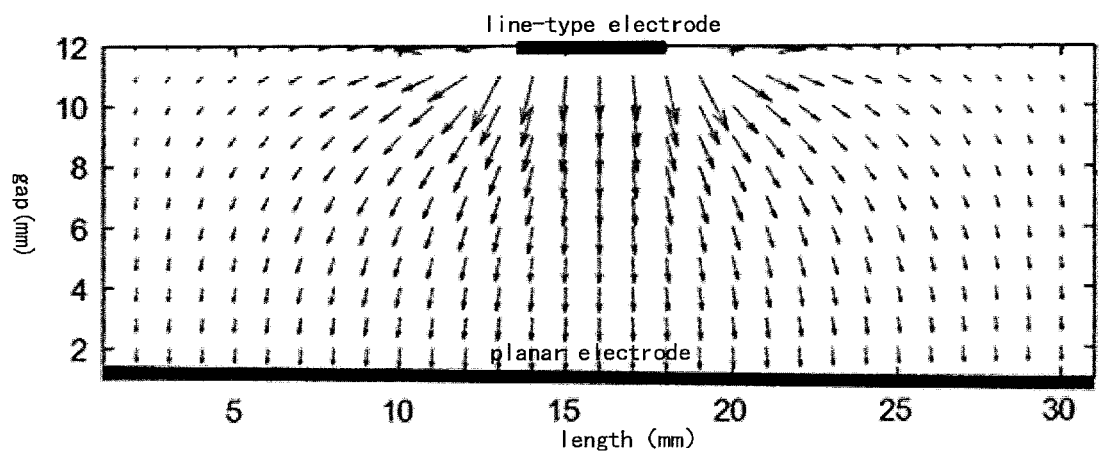
FIG. 10 is a view showing a distribution of orientations of liquid crystal molecules after a driving voltage is applied between driving electrodes on both sides of a liquid crystal layer, wherein one of the driving electrodes is a planar electrode and the other is a line-type electrode.

It should be noted that, in the embodiments of the present disclosure, the electrode used for driving the liquid crystal layer 8 includes a line-type electrode (i.e., strip electrodes of the slot capacitor C in the resonant structure 4), it may still ensure effective driving of the liquid crystal layer. Referring to FIG. 10, the liquid crystal molecules within a certain range of the line-type electrode and its surroundings may be effectively driven. It is set that the equivalent dielectric constant of the liquid crystal layer only directly under the line-type electrode changes under the action of the driving voltage, while the equivalent dielectric constant of the liquid crystal layer elsewhere remains unchanged for any driving voltage. Through the simulation, the results show that even under such setting, the microwave amplitude-phase controller 100 in the embodiments of the present disclosure may still effectively control the amplitude and/or phase of the microwave signal.

The above description is only the specific embodiment of the present disclosure, but the scope of protection of the present disclosure is not limited thereto. Any changes or substitutions that may be easily conceived by those skilled in the art within the scope of the present disclosure are intended to be included within the scope of the present disclosure. Therefore, the scope of protection of the present disclosure should be determined by the scope of the claims.

What is claimed is:

1. A microwave amplitude-phase controller comprising:
   a first substrate and a second substrate opposite to each other;
   a liquid crystal layer between the first substrate and the second substrate;
   a conductive layer on a side of the first substrate facing the liquid crystal layer, the conductive layer being configured to receive a first voltage signal; and
   a resonant structure on a side of the second substrate facing the liquid crystal layer, the resonant structure being configured to receive a second voltage signal and to transmit a microwave signal,
   wherein the resonant structure comprises:
   a capacitor comprising two electrodes opposite to each other, the two electrodes being respectively located at both ends of the capacitor and being on the side of the second substrate facing the liquid crystal layer;
   a bridged conductive structure in parallel with the capacitor, both ends of the bridged conductive structure being connected to the two electrodes of the capacitor, respectively; and
   a first signal line and a second signal line respectively electrically connected to the two electrodes of the capacitor, the first signal line being configured to receive a microwave signal to be modulated, and the second signal being configured to output a modulated microwave signal.

2. The microwave amplitude-phase controller according to claim 1 further comprising:
   a first alignment film between the conductive layer and the liquid crystal layer; and
   a second alignment film between the resonant structure and the liquid crystal layer.

3. The microwave amplitude-phase controller according to claim 2, wherein the first alignment film and the second alignment film have the same alignment direction.

4. The microwave amplitude-phase controller according to claim 1, wherein the capacitor comprises a first conductive strip and a second conductive strip which are opposite and parallel to each other, and spaced apart from each other, the first conductive strip and the second conductive strip having equal length and equal width, and wherein the bridged conductive structure comprises a third conductive strip which is axisymmetric, the third conductive strip having an axis of symmetry parallel to both the first conductive strip and the second conductive strip.

5. The microwave amplitude-phase controller according to claim 4, wherein the resonant structure further comprises a first connecting line and a second connecting line, the first conductive strip is electrically connect to the first signal line and one end of the bridged conductive structure through the first connecting line, and the second conductive strip is electrically connected to the second signal line and the other end of the bridged conductive structure through the second connecting line.

6. The microwave amplitude-phase controller according to claim 5, wherein the first conductive strip and the second conductive strip are both elongated and are perpendicular to the first connecting line and the second connecting line, respectively.

7. The microwave amplitude-phase controller according to claim 6, wherein a gap between the first conductive strip and the second first conductive strip has a width less than or equal to $0.5\lambda$, wherein $\lambda$ is an operating wavelength of a microwave to be modulated.

8. The microwave amplitude-phase controller according to claim 4, wherein the first conductive strip and second conductive strip are symmetrically arranged with respect to the axis of symmetry of the third conductive strip.

9. The microwave amplitude-phase controller according to claim 4, wherein a length of the third conductive strip is less than or equal to $1\lambda$, wherein $\lambda$ is an operating wavelength of a microwave to be modulated.

10. The microwave amplitude-phase controller according to claim 4, wherein the first conductive strip and the second conductive strip have a length less than or equal to $0.5\lambda$ and a width less than or equal to $0.5\lambda$, wherein $\lambda$ is an operating wavelength of a microwave to be modulated.

11. The microwave amplitude-phase controller according to claim 1, wherein the capacitor comprises two interdigitated electrodes which are opposite to each other and spaced apart from each other.

12. The microwave amplitude-phase controller according to claim 1, wherein an orthographic projection of the liquid crystal layer on the first substrate at least covers an orthographic projection of the capacitor on the first substrate.

13. The microwave amplitude-phase controller according to claim 1, wherein a thickness of the liquid crystal layer is less than or equal to $0.5\lambda$, wherein $\lambda$ is an operating wavelength of a microwave to be modulated.

14. The microwave amplitude-phase controller according to claim 1, further comprising:
    a frame between the first substrate and the second substrate,
    wherein the frame, the first substrate and the second substrate enclose a cavity, the liquid crystal layer being filled in the cavity.

15. The microwave amplitude-phase controller according to claim 1, wherein the conductive layer is grounded.

16. A method of controlling amplitude and phase of a microwave by using the microwave amplitude-phase controller according to claim 1, comprising:
    applying the first voltage signal to the conductive layer of the microwave amplitude-phase controller, and applying the second voltage signal to the resonant structure of the microwave amplitude-phase controller; and
    inputting a microwave signal to be modulated to the resonant structure of the microwave amplitude-phase controller, and adjusting a voltage difference between the first voltage signal and the second voltage signal until a modulated microwave signal output by the resonant structure has required amplitude and phase.

\* \* \* \* \*